(12) United States Patent
Then et al.

(10) Patent No.: US 11,362,082 B2
(45) Date of Patent: Jun. 14, 2022

(54) IMPLANTED SUBSTRATE CONTACT FOR IN-PROCESS CHARGING CONTROL

(71) Applicant: Intel Corporation, Santa Clara, CA (US)

(72) Inventors: Han Wui Then, Portland, OR (US); Paul Fischer, Portland, OR (US); Walid Hafez, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 846 days.

(21) Appl. No.: 16/016,419

(22) Filed: Jun. 22, 2018

(65) Prior Publication Data

US 2019/0393211 A1    Dec. 26, 2019

(51) Int. Cl.
*H01L 27/02* (2006.01)
*H01L 29/10* (2006.01)
*H01L 23/62* (2006.01)
*H01L 21/265* (2006.01)
*H01L 27/06* (2006.01)

(52) U.S. Cl.
CPC .... *H01L 27/0255* (2013.01); *H01L 21/26513* (2013.01); *H01L 21/26546* (2013.01); *H01L 27/0248* (2013.01); *H01L 27/0605* (2013.01); *H01L 29/1087* (2013.01); *H01L 23/62* (2013.01)

(58) Field of Classification Search
CPC ............. H01L 27/0248; H01L 27/0255; H01L 27/0605; H01L 21/26513; H01L 21/26546; H01L 29/1087
USPC ......................................................... 257/773
See application file for complete search history.

(56) References Cited

U.S. PATENT DOCUMENTS

| | | | |
|---|---|---|---|
| 2013/0240952 A1* | 9/2013 | Wong | H01L 29/861 257/E21.407 |
| 2013/0256699 A1* | 10/2013 | Vielemeyer | H01L 27/0248 257/77 |
| 2017/0084601 A1* | 3/2017 | Yao | H01L 29/866 |
| 2018/0090477 A1* | 3/2018 | Yin | H01L 29/861 |

* cited by examiner

*Primary Examiner* — David Vu
*Assistant Examiner* — Brandon C Fox
(74) *Attorney, Agent, or Firm* — Schwabe, Williamson & Wyatt, P.C.

(57) ABSTRACT

A substrate contact diode is disclosed. The substrate contact includes a first type substrate implant tap in a substrate, a second type epitaxial implant in an epitaxial layer that is on the substrate, and a first type epitaxial region above the second type epitaxial implant. A contact electrode that extends upward from the top of the first type epitaxial region to the surface of an interlayer dielectric that surrounds the contact electrode.

22 Claims, 7 Drawing Sheets

IMPLANTED SUBSTRATE CONTACT FOR IN-PROCESS CHARGING CONTROL

TECHNICAL FIELD

Embodiments of the disclosure pertain to in-process charging control and, in particular, to a substrate contact for in-process charging control.

BACKGROUND

GaN technologies implemented on Si substrates are susceptible to in process charging/arcing due to the semi-insulating nature of the GaN material system and high-resistivity Si substrates used for high frequency radio frequency (RF) applications. Conventional approaches to charging protection rely on deep and large area silicon contact shunts.

A disadvantage of conventional solutions is the process complexity involved in creating deep and large area substrate connections. In addition, topographical imperatives involved in the implementation of conventional solutions limit scaling as large keep-away limits must be maintained to mitigate density interactions with surrounding circuitry. For highly scaled RF front-end technologies this area penalty can be a substantial fraction of the product die area.

DESCRIPTION OF THE EMBODIMENTS

Figure 1:
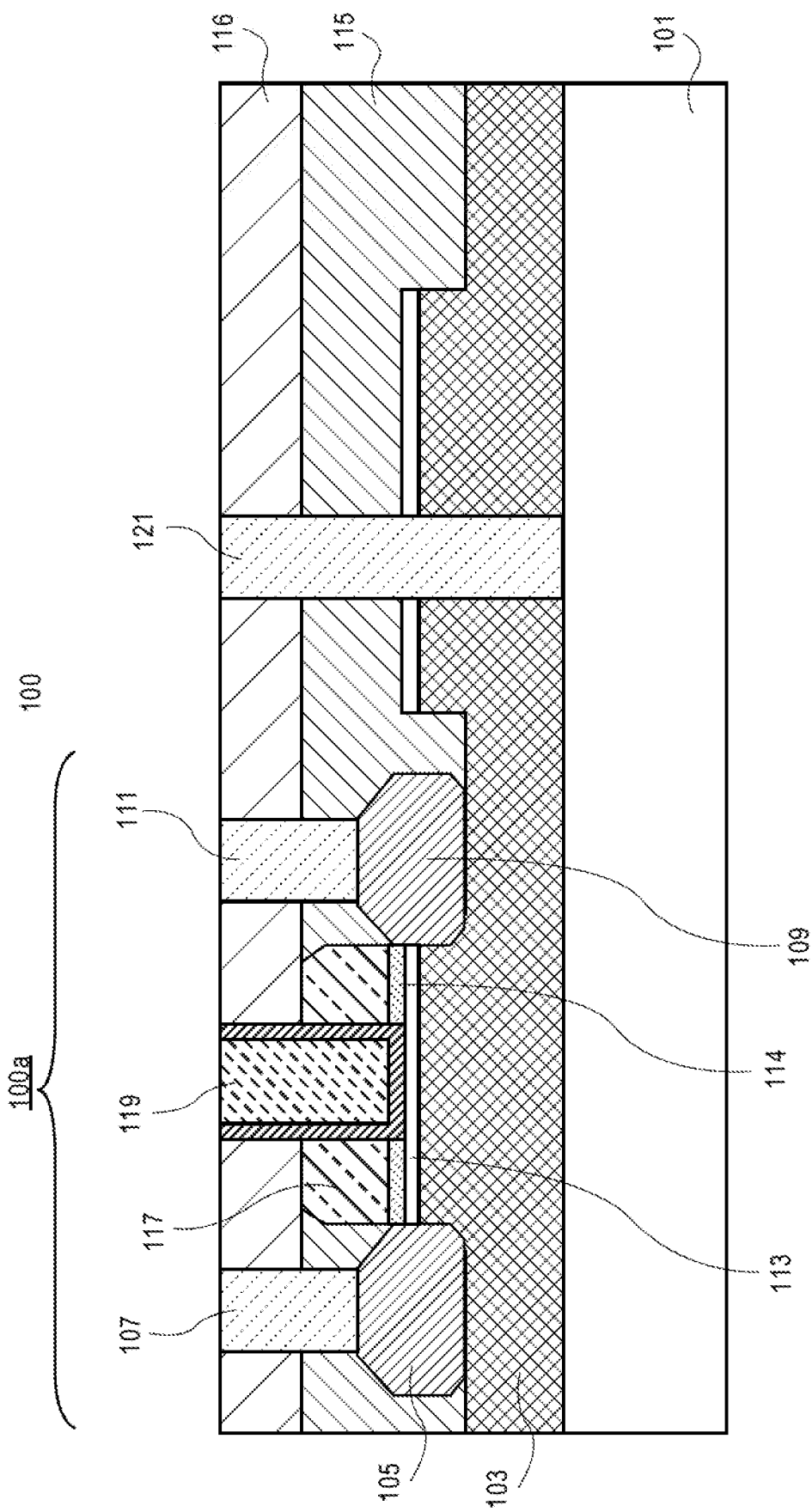
FIG. 1 is an illustration of a cross-section of a semiconductor structure that includes a substrate contact shunt according to a previous approach.

Implanted contacts for in-process substrate charging control is described. It should be appreciated that although embodiments are described herein with reference to examples, the disclosure is more generally applicable to other implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

A disadvantage of previous approaches to in-process charging control is the complexity involved in creating deep, and large area, substrate connections. In addition, topographical considerations involved in the implementation of previous solutions limit scaling, e.g., because of the large keep-away limits that must be maintained to mitigate density interactions with surrounding circuitry. For highly scaled RF front-end technologies this area penalty can be a substantial fraction of the product die area. A process and device that addresses the shortcomings of such approaches is disclosed herein. As part of a disclosed process, instead of a deep, large area substrate connection, deep implants are used to connect an in-process substrate charging control structure to the substrate. By using implants rather than etch and metal fill process components, the cost and area penalties that are encountered using previous approaches can be avoided.

FIG. 1 is an illustration of a cross-section of a semiconductor structure 100 that includes a substrate contact shunt of a previous approach. FIG. 1 shows substrate 101, epitaxial layer 103, source 105, source contact 107, drain 109, drain contact 111, semiconductor 113, semiconductor 114, insulator 115, insulator 116, sidewall spacers 117, gate 119 and substrate contact 121. In the approach of FIG. 1, the materials used to form substrate 101, epitaxial layer 103, source 105, source contact 107, drain 109, drain contact 111, semiconductor 113, semiconductor 114, insulator 115, insulator 116, sidewall spacers 117, gate 119 and substrate contact 121 can be conventional.

Referring to FIG. 1, the substrate contact 121 extends downward from the surface of the semiconductor structure 100, through the insulator 116, the insulator 115, the insulator 113 and the epitaxial layer 103, to contact the substrate 101. In FIG. 1, the gallium nitride epitaxial layer 103 on the silicon substrate 101 is used for high-frequency RF applications. The semi-insulating character of the gallium nitride epitaxial layer 103 on the high-resistivity silicon substrate 101 makes the semiconductor structure 100 susceptible to charging and/or arcing. In the approach of FIG. 1, the substrate contact 121 is used to ground high discharges of current that are generated by in process charging and/or arcing that can cause damage to the semiconductor structure 100 and/or the fabrication tool that is used to form the semiconductor structure 100.

The shortcomings of the FIG. 1 approach include the process complexity that is involved in creating the deep and large area substrate contact 121. For example, in FIG. 1, the process that is used to form the substrate contact 121 requires a deep gallium nitride etch through the body of epitaxial layer 103 in order to contact the substrate 101. Creating a multi micron deep, high aspect ratio etch in gallium nitride is challenging. The metal fill and planarization operations require integration into the transistor fabrication process without impacting functional circuitry.

For example, the integration of the fabrication process of the substrate contact 121 with the fabrication process of the transistor 100*a* requires an adherence to large keep-away limits (distances that must be maintained between the substrate contact 121 and other circuitry of semiconductor structure 100) to mitigate density interactions with surrounding circuitry. These distances exact a severe area penalty. In particular, the keep away area can involve a substantial portion of the die area of a product, and thus can be prohibitive for highly scaled RF front-end applications. As such, topographical considerations that relate to integrating the substrate contact 121 with the transistor 100*a* limit scaling potential in the FIG. 1 approach.

Figure 2A:
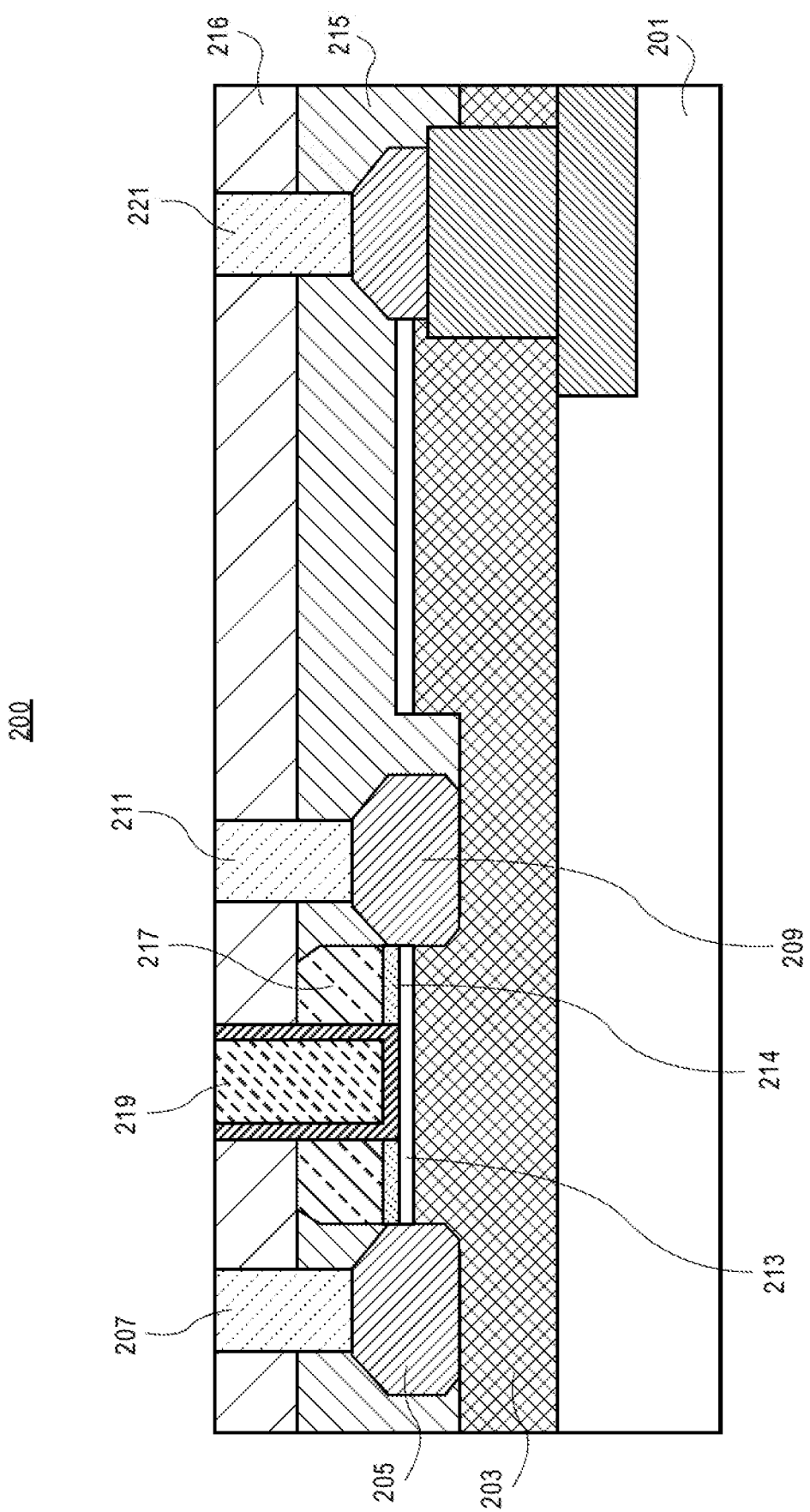
FIG. 2A is an illustration of a cross-section of a semiconductor structure that includes a substrate contact diode according to an embodiment.

FIG. 2A is an illustration of a cross-section of a semiconductor structure 200 that includes a substrate contact diode according to an embodiment. FIG. 2 shows substrate 201, epitaxial layer 203, source 205, source contact 207, drain 209, drain contact 211, semiconductor 213, semiconductor 214, insulator 215, insulator 216, sidewall spacers 217, gate 219 and substrate contact diode 221.

Referring to FIG. 2A the epitaxial layer 203 is formed above the substrate 201. The semiconductor 213 is formed above the epitaxial layer 203. The semiconductor 214 is formed above semiconductor 213 and adjacent the sides of the gate 219. The gate 219 is formed above the semiconductor 213 and is bracketed by sidewall spacers 217. The source 205 is formed in a trench that is formed in the epitaxial layer 203 and extends above the surface of the epitaxial layer 203. The source contact 207 is formed above the source 205. The drain 209 is formed in a trench that is formed in the epitaxial layer 203 and extends above the surface of the epitaxial layer 203. The drain contact 211 is formed above the drain 209. The sidewall spacers 217 are formed adjacent the sidewalls of the gate 219. The substrate contact diode 221 extends from the surface of the semiconductor structure 200 through the insulator 216, the insulator 215, the semiconductor 213 and the epitaxial layer 203, into the substrate 201.

In an embodiment, the substrate 201 can be formed from silicon. In other embodiments, the substrate 201 can be formed from other materials. In an embodiment, the epitaxial layer 203 can be formed from gallium nitride. In other embodiments, the epitaxial layer can be formed from other materials. In an embodiment, the source 205 can be formed from indium gallium nitride. In other embodiments, the source 205 can be formed from other materials. In an embodiment, the source contact 207 can be formed from Al, Ti, TiAl, TiAlN, Ta and TaN. In other embodiments, the source contact 207 can be formed from other materials. In an embodiment, the drain 209 can be formed from indium gallium nitride. In other embodiments, the drain 209 can be formed from other materials. In an embodiment, the drain contact 211 can be formed from Al, Ti, TiAl, TiAlN, Ta and TaN. In other embodiments, the drain contact 211 can be formed from other materials. In an embodiment, the semiconductor 213 can be formed from aluminum nitride. In other embodiments, the semiconductor 213 can be formed from other materials. In an embodiment, the semiconductor 214 can be formed from aluminum indium nitride. In other embodiments, the semiconductor 214 can be formed from other materials. In an embodiment, the insulator 215 can be formed from an oxide. In other embodiments, the insulator 215 can be formed from other materials. In an embodiment, the insulator 216 can be formed from an oxide. In other embodiments, the insulator 216 can be formed from other materials. In an embodiment, the sidewall spacers 217 can be formed from a nitride. In other embodiments, the sidewall spacers 217 can be formed from other materials. In an embodiment, the gate 219 can be formed from materials such as Al, Ti, TiAl, TiAlN, Ta and TaN. In other embodiments, the gate 219 can be formed from other materials.

In an embodiment, the insulator 215 and the insulator 216 can be 50 nm to 500 nm thick. In other embodiments, the insulator 215 and the insulator 216 can have other thicknesses. In an embodiment, the epitaxial layer 203 can be 500 nm to 5 μm thick. In other embodiments, the epitaxial layer 203 can have other thicknesses. In an embodiment, the substrate 201 can be 500 to 1000 μm thick. In other embodiments, the substrate 201 can have other thicknesses.

Figure 2C:
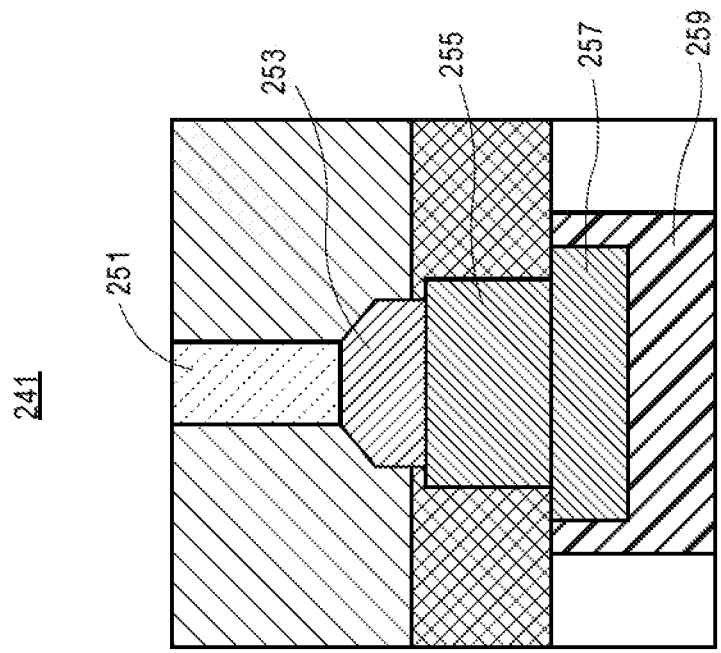
FIG. 2C is an illustration of a substrate contact diode that can be used as a charging protection device according to an embodiment.
Figure 2B:
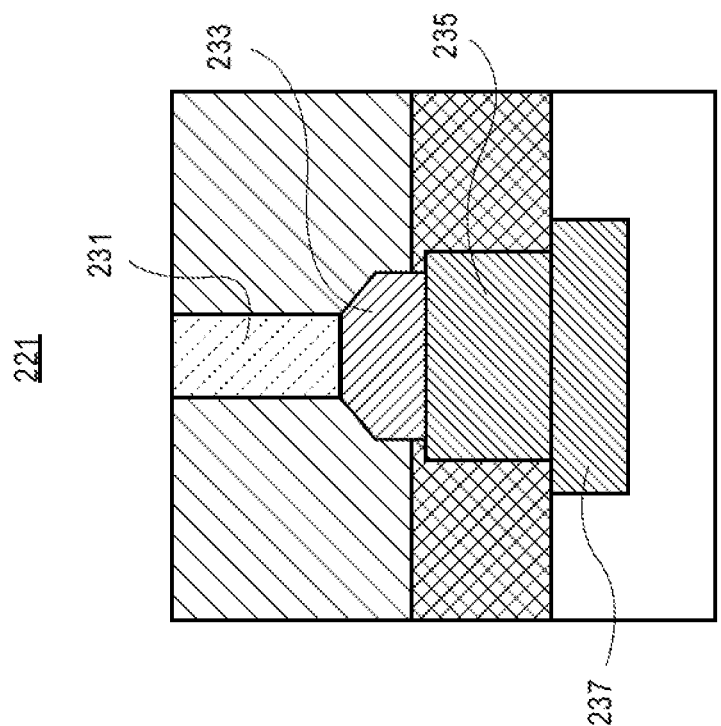
FIG. 2B is an illustration of a substrate contact diode that can be used as a charging protection device according to an embodiment.

The material structure and composition of the substrate contact diode 221 is described with reference to FIG. 2B. Referring to FIG. 2B, the substrate contact diode 221 includes contact 231, first n+ region 233, implanted n– region 235, and implanted n+ substrate tap 237. The contact 231 is formed above the first n+ region 233. The first n+ region 233 is formed above the implanted n– region 235. The implanted n– region 235 is formed above the implanted n+ substrate tap 237. In an embodiment, the first n+ region 233 is an epitaxial region. In an embodiment, the implanted n– region 235 can be formed from silicon. In other embodiments, the implanted n– region 235 can be formed from other materials. In an embodiment, the implanted n+ substrate tap 237 can be formed from phosphorous. In other embodiments, the implanted n+ substrate tap 237 can be formed from other materials. FIG. 2C is an illustration of another example substrate contact diode 241 according to an embodiment.

Referring to FIG. 2C, substrate diode 241 includes contact 251, first n+ region 253, implanted n– region 255, implanted n+ substrate tap 257 and implanted p-well 259. The contact 251 is formed above the first n+ region 253. The first n+ region 253 is formed above the implanted n– region 255. The implanted n– region 255 is formed above the implanted n+ substrate tap 257. The implanted n+ substrate tap 257 is formed in the implanted p-well 259. In an embodiment, the implant depth can range from a few nanometers to 10 micrometers. In other embodiments, other implant depths can be used.

Substrate contact diode 221 and substrate contact diode 241 utilize deep implants to connect the contact structure 231 and the contact structure 251 to the silicon substrate 201. The use of implants rather than etch and fill processes enable an avoidance of the cost and area penalties that are encountered using previous approaches. Additionally, the process complexity is reduced and more aggressive lateral scaling of the in process charge structure and guard rings is enabled.

Referring again to FIG. 2A, in operation, during the fabrication of semiconductor structure 200 conditions such as potential differences between the surface of the semiconductor structure 200 and other parts of the semiconductor structure 200 can cause a buildup of charge and/or induce large discharges of current that can result in arcing between parts of the semiconductor structure 200. In an embodiment, the substrate contact diode 221 enables the charge that accumulates during the in-fab plasma process to safely drain. In particular, the substrate contact diode 221 creates a conductive channel from the source contact 211 or the drain contact 207 to the substrate 201. In an embodiment, either a single implant or staggered implants can be used to create an effective conduction path. It should be appreciated that the N+ implant 237 can be formed before the growth of the epitaxial layer 203 or a buffer layer in order to provide a more efficient substrate contact, further improving charge drainage.

FIGS. 3A-3G are illustrations of cross-sections of a semiconductor substrate contact diode during fabrication according to an embodiment.

Figure 3A:
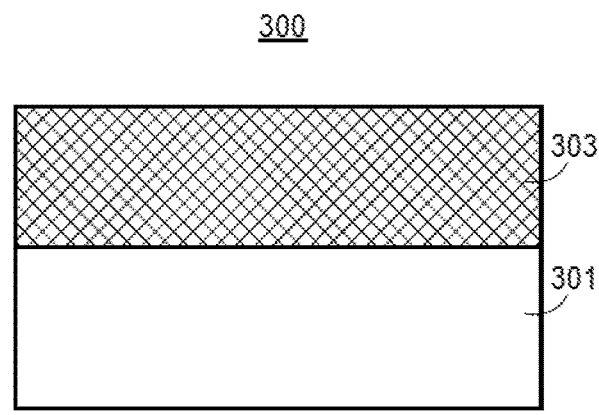
FIGS. 3A-3G are illustrations of cross-sections of a substrate contact diode during fabrication according to an embodiment.

Referring to FIG. 3A, one or more operations are executed as part of the formation of the epitaxial layer 303 on the substrate 301. In an embodiment, the substrate can be formed from silicon. In other embodiments, the substrate 301 can be formed from other materials. In an embodiment, the epitaxial layer 303 can be formed from gallium nitride. In other embodiments, the epitaxial layer 303 can be formed from other materials.

Figure 3B:
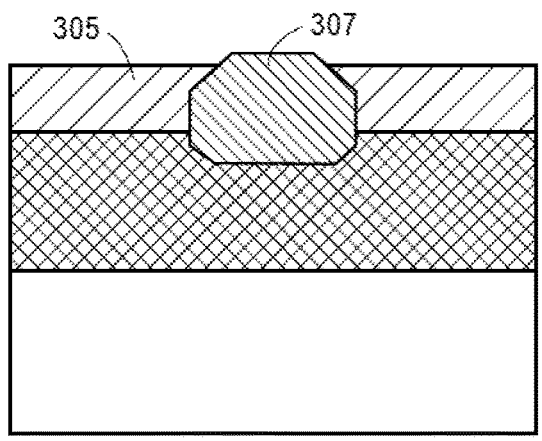

Referring to FIG. 3B, after one or more operations that result in the cross-section shown in FIG. 3A, an n+ epitaxial material is grown and patterned to form n+ epitaxial region 307. The interlayer dielectric layer 305 is formed above the substrate 301.

Figure 3C:
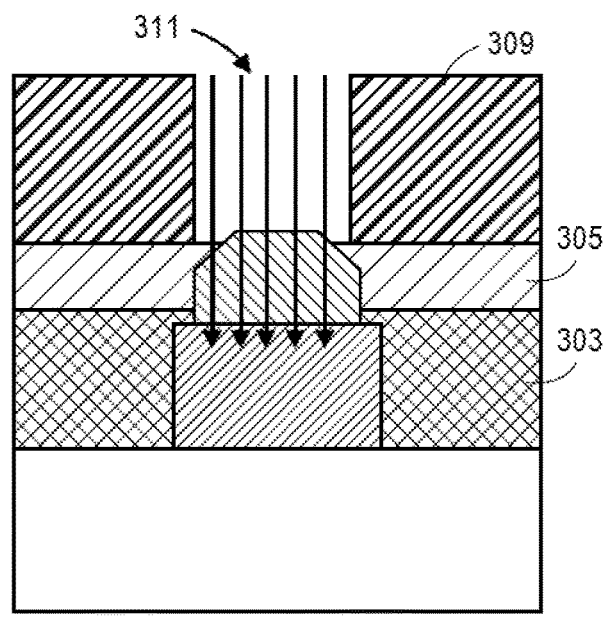

Referring to FIG. 3C, after one or more operations that result in the cross-section shown in FIG. 3B, resist 309 is formed on the interlayer dielectric layer 305 and an implantation window 311 is formed. Thereafter, n− type implants are implanted through the window into the epitaxial layer 303 (e.g., gallium nitride). In an embodiment, the n− type implants can be silicon n type implants. In other embodiments, the n− type implants can be formed from other materials.

Figure 3D:
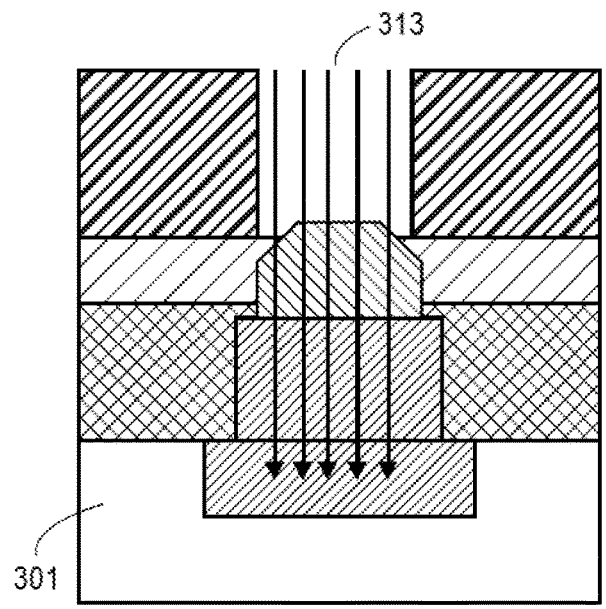

Referring to FIG. 3D, after one or more operations that result in the cross-section shown in FIG. 3C, n+ type implants are formed in the silicon substrate 301. In an embodiment, the n+ type implants can be n+ type phosphorous implants. In other embodiments, the n+ type implants can be formed from other materials.

Figure 3E:
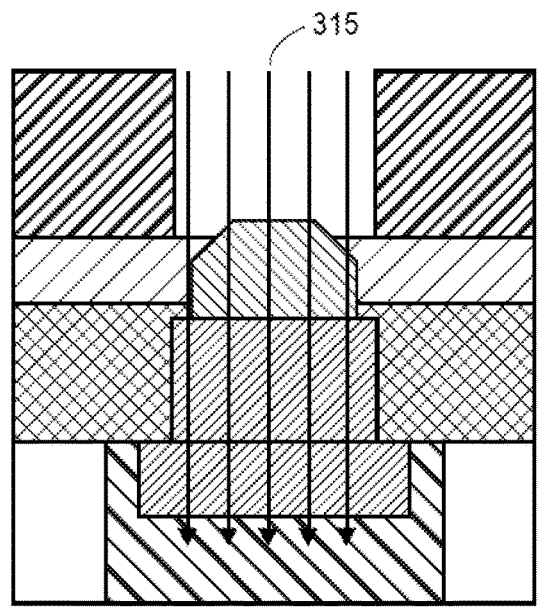

Referring to FIG. 3E, after one or more operations that result in the cross-section shown in FIG. 3D, p− type well implants are formed in the silicon substrate. The p− type well implants surround the substrate implants. In an embodiment, the p-well implants can be formed from boron implants. In other embodiments, the p− type well implants can be formed from other material.

Figure 3F:
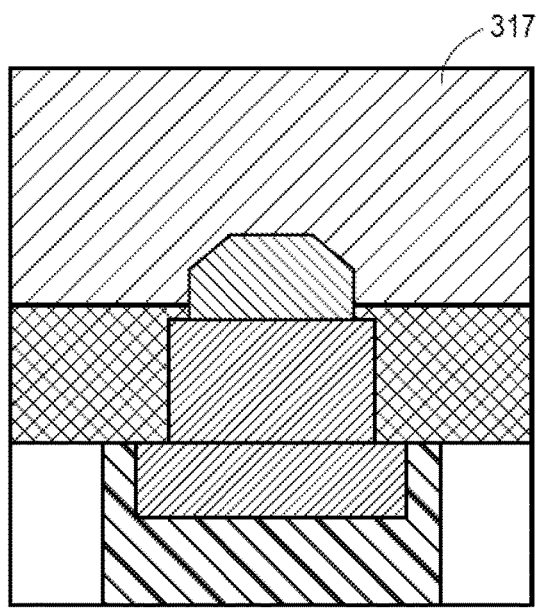

Referring to FIG. 3F, after one or more operations that result in the cross-section shown in FIG. 3E, an ILD fill 317 and planarization is executed.

Figure 3G:
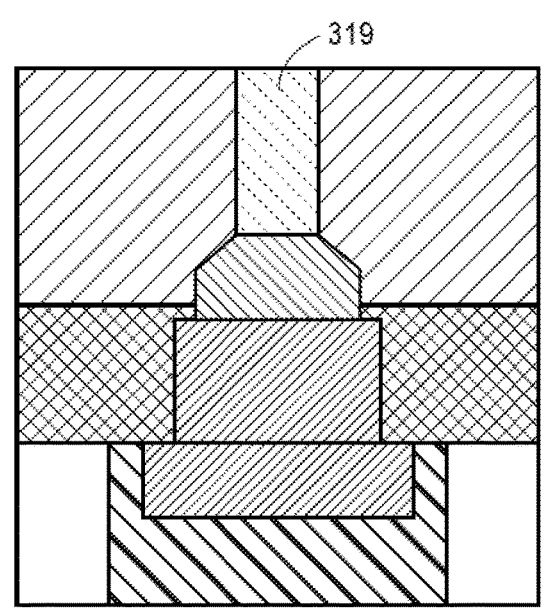

Referring to FIG. 3G, after one or more operations that result in the cross-section shown in FIG. 3F, contact patterning is performed on the surface of the semiconductor structure 300 and a contact trench is etched. Subsequently, the trench is filled with conductive material 319 and the surface of the semiconductor structure 300 surface polished for planarization purposes. In other embodiments, the surface can be planarized using other techniques.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
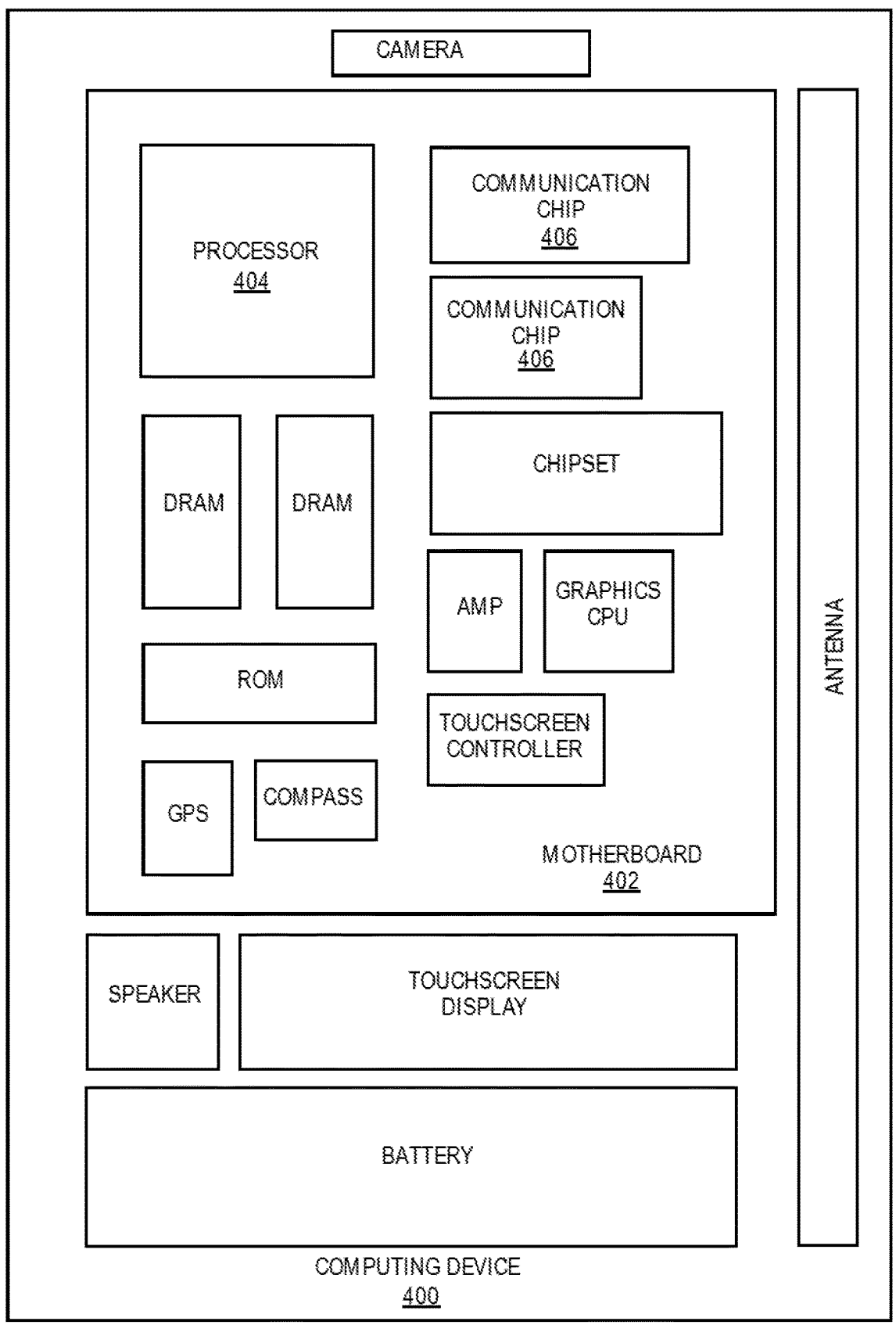
FIG. 4 illustrates a computing device in accordance with one implementation of an embodiment.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
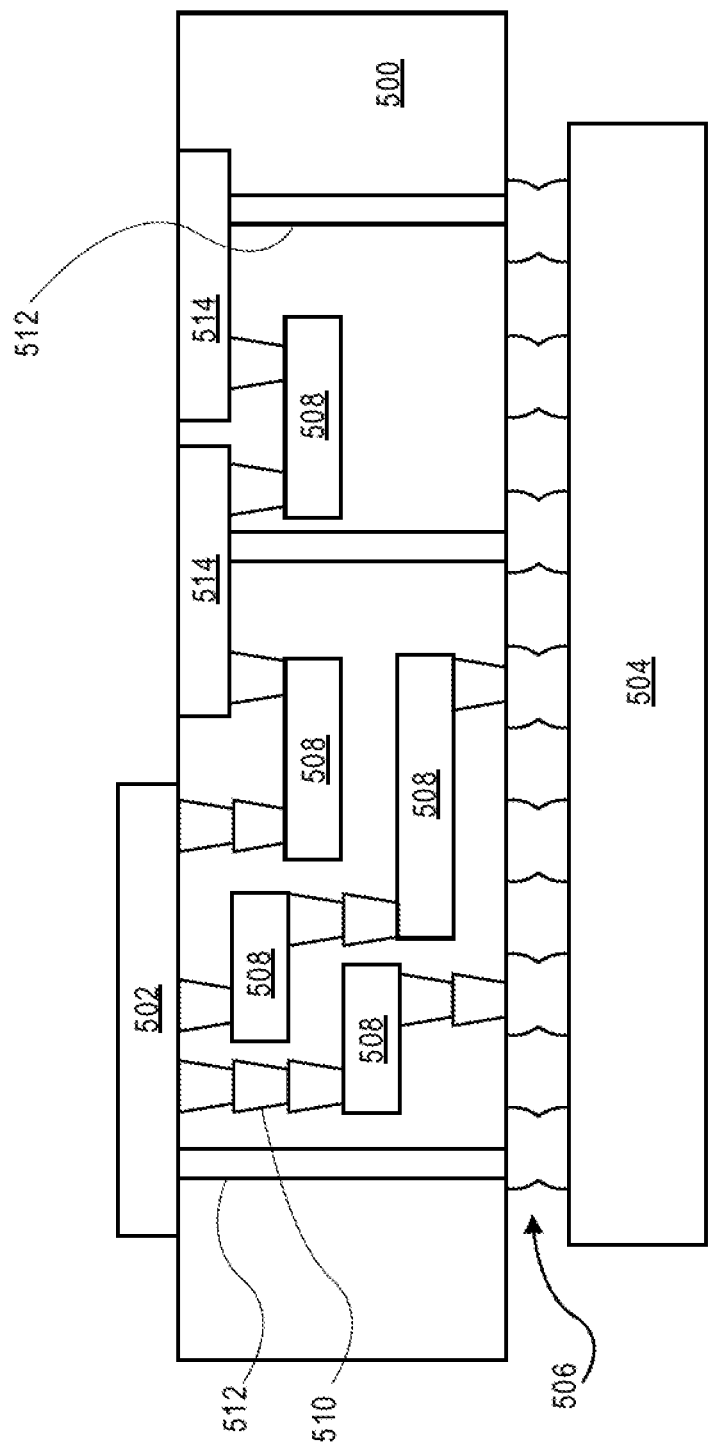
FIG. 5 illustrates an interposer that includes one or more embodiments.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A substrate contact diode including a first type substrate implant tap in a substrate, a second type epitaxial implant in an epitaxial layer that is formed on the substrate, and a first type epitaxial region above the second type epitaxial implant. The contact electrode that extends upward from the top of the first type epitaxial region to the surface of an interlayer dielectric that surrounds the contact.

Example Embodiment 2

The substrate contact diode of example embodiment 1, further comprising a p-well implant surrounding the first type substrate implant tap.

Example Embodiment 3

The substrate contact diode of example embodiment 1, wherein the substrate implant tap is an n+ type implant.

Example Embodiment 4

The substrate contact diode of example embodiment 1, wherein the second type epitaxial implant is an n− type implant.

Example Embodiment 5

The substrate contact diode of example embodiment 1, wherein the first type epitaxial region is an n+ type region.

Example Embodiment 6

The substrate contact diode of example embodiment 1, wherein the contact electrode is narrower in width than the first type epitaxial region.

Example Embodiment 7

The substrate contact diode of example embodiments 1, 2, 3, 4, 5 or 6 wherein functional circuitry is formed on the substrate in a predetermined proximity to the substrate contact electrode.

Example Embodiment 8

A semiconductor structure includes a semiconductor device comprising semiconductor material, insulator material and metal material. The semiconductor structure also includes a substrate contact diode coupled to the semiconductor device, comprising a first type substrate implant tap in a substrate, a second type epitaxial implant in an epitaxial layer that is formed on the substrate, and a first type epitaxial region above the second type epitaxial implant. The contact electrode extends upward from the top of the first type epitaxial region to the surface of an interlayer dielectric that surrounds the contact.

Example Embodiment 9

The semiconductor structure of example embodiment 8, further comprising a p-well implant surrounding the first type substrate implant tap.

Example Embodiment 10

The semiconductor structure of example embodiment 8, wherein the substrate implant tap is an n+ type implant.

Example Embodiment 11

The semiconductor structure of example embodiment 8, wherein the second type epitaxial implant is an n− type implant.

Example Embodiment 12

The semiconductor structure of example embodiment 8, wherein the first type epitaxial region is an n+ type region.

Example Embodiment 13

The semiconductor structure of example embodiment 8, wherein the contact electrode is narrower in width than the first type epitaxial region.

Example Embodiment 14

The semiconductor structure of example embodiments 8, 9, 10, 11, 12 or 13 wherein the substrate contact is formed on the substrate in a predetermined proximity to the semiconductor device.

Example Embodiment 15

A method includes forming a first type substrate implant tap in a substrate, forming a second type epitaxial implant in an epitaxial layer that is formed on the substrate and forming a first type epitaxial region above the second type epitaxial implant. A contact electrode is formed that extends upward from the top of the first type epitaxial region to the surface of an interlayer dielectric that surrounds the contact electrode.

Example Embodiment 16

The method of example embodiment 15, further comprising a p-well implant surrounding the first type substrate implant tap.

Example Embodiment 17

The method of example embodiment 15, wherein the substrate implant tap is an n+ type implant.

Example Embodiment 18

The method of example embodiment 15, wherein the second type epitaxial implant is an n− type implant.

Example Embodiment 19

The method of example embodiment 15, wherein the first type epitaxial region is an n+ type region.

Example Embodiment 20

The method of example embodiments 15, 16, 17, 18 or 19 wherein the contact is narrower in width than the first type epitaxial region.

What is claimed is:

1. A substrate contact diode, comprising:
   a first type substrate implant tap in a substrate;
   a second type epitaxial implant in an epitaxial layer that is on the substrate, the second type epitaxial implant having an uppermost surface;
   a first type epitaxial region above the second type epitaxial implant, the first type epitaxial region having an uppermost surface above the uppermost surface of the second type epitaxial implant; and
   a contact electrode that extends upward from the top of the first type epitaxial region to the surface of an interlayer dielectric that surrounds the contact electrode.

2. The substrate contact diode of claim 1, further comprising a p-well implant surrounding the first type substrate implant tap.

3. The substrate contact diode of claim 1, wherein the substrate implant tap is an n+ type implant.

4. The substrate contact diode of claim 1, wherein the second type epitaxial implant is an n− type implant.

5. The substrate contact diode of claim 1, wherein the first type epitaxial region is an n+ type region.

6. The substrate contact diode of claim 1, wherein the contact electrode is narrower in width than the first type epitaxial region.

7. The substrate contact diode of claim 1, wherein functional circuitry is on the substrate in a predetermined proximity to the substrate contact.

8. A semiconductor structure, comprising:
   a semiconductor device comprising:
   a semiconductor material;
   an insulator material; and
   a metal material,
   a substrate contact diode coupled to the semiconductor device, comprising:
   a first type substrate implant tap in a substrate;
   a second type epitaxial implant in an epitaxial layer that is on the substrate, the second type epitaxial implant having an uppermost surface;
   a first type epitaxial region above the second type epitaxial implant, the first type epitaxial region having an uppermost surface above the uppermost surface of the second type epitaxial implant; and
   a contact electrode that extends upward from the top of the first type epitaxial region to the surface of an interlayer dielectric that surrounds the contact electrode.

9. The semiconductor structure of claim 8, further comprising a p-well implant surrounding the first type substrate implant tap.

10. The semiconductor structure of claim 8, wherein the substrate implant tap is an n+ type implant.

11. The semiconductor structure of claim 8, wherein the first type epitaxial region is an n+ type region.

12. The semiconductor structure of claim 8, wherein the second type epitaxial implant is an n− type implant.

13. The semiconductor structure of claim 8, wherein the contact electrode is narrower in width than the first type epitaxial region.

14. The semiconductor structure of claim 8, wherein the substrate contact is on the substrate in a predetermined proximity to the semiconductor device.

15. A method, comprising:
   forming a first type substrate implant tap in a substrate;
   forming a second type epitaxial implant in an epitaxial layer that is formed on the substrate, the second type epitaxial implant having an uppermost surface;
   forming a first type epitaxial region above the second type epitaxial implant, the first type epitaxial region having an uppermost surface above the uppermost surface of the second type epitaxial implant; and
   forming a contact electrode that extends upward from the top of the first type epitaxial region to the surface of an interlayer dielectric that surrounds the contact electrode.

16. The method of claim 15, further comprising a p-well implant surrounding the first type substrate implant tap.

17. The method of claim 15, wherein the substrate implant tap is an n+ type implant.

18. The method of claim 15, wherein the second type epitaxial implant is an n− type implant.

19. The method of claim 15, wherein the first type epitaxial region is a n+ type region.

20. The method of claim 15, wherein the contact electrode is narrower in width than the first type epitaxial region.

21. A substrate contact diode, comprising:
- a first type substrate implant tap in a substrate;
- a p-well implant surrounding the first type substrate implant tap;
- a second type epitaxial implant in an epitaxial layer that is on the substrate;
- a first type epitaxial region above the second type epitaxial implant; and
- a contact electrode that extends upward from the top of the first type epitaxial region to the surface of an interlayer dielectric that surrounds the contact electrode.

22. A substrate contact diode, comprising:
- a first type substrate implant tap in a substrate;
- a second type epitaxial implant in an epitaxial layer that is on the substrate;
- a first type epitaxial region above the second type epitaxial implant, wherein the first type epitaxial region is an n+ type region; and
- a contact electrode that extends upward from the top of the first type epitaxial region to the surface of an interlayer dielectric that surrounds the contact electrode.

* * * * *